United States Patent
Van der Lee et al.

(10) Patent No.: US 11,092,536 B2
(45) Date of Patent: Aug. 17, 2021

(54) LASER SENSOR MODULE FOR PARTICLE DETECTION WITH OFFSET BEAM

(71) Applicant: Philips Photonics GmbH, Ulm (DE)

(72) Inventors: Alexander Marc Van der Lee, Eindhoven (NL); Johannes Hendrikus Maria Spruit, Eindhoven (NL); Petrus Theodorus Jutte, Eindhoven (NL)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 77 days.

(21) Appl. No.: 16/569,750

(22) Filed: Sep. 13, 2019

(65) Prior Publication Data

US 2020/0003673 A1   Jan. 2, 2020

Related U.S. Application Data

(63) Continuation of application No. PCT/EP2018/055524, filed on Mar. 7, 2018.

(30) Foreign Application Priority Data

Mar. 15, 2017   (EP) .................................... 17160985

(51) Int. Cl.
*G01N 15/14*   (2006.01)
*G01N 15/06*   (2006.01)

(52) U.S. Cl.
CPC ......... *G01N 15/1434* (2013.01); *G01N 15/06* (2013.01); *G01N 15/1429* (2013.01);
(Continued)

(58) Field of Classification Search
CPC ........... G01N 15/0205; G01N 15/1434; G01N 2015/03; G01N 2015/1075;
(Continued)

(56) References Cited

U.S. PATENT DOCUMENTS

| 5,594,543 A | 1/1997 | De Groot et al. |
| 10,379,028 B2 * | 8/2019 | Spruit .................... G01S 17/95 |

(Continued)

FOREIGN PATENT DOCUMENTS

| DE | 102015207289 A1 | 10/2016 |
| WO | 0237410 A1 | 5/2002 |

(Continued)

OTHER PUBLICATIONS

Giuliani, et al.: "Laser Diode Self-Mixing Technique for Sensing Applications," *Journal of Optics A: Pure and Applied Optics* 4: S283-S294 (Nov. 4, 2002).

(Continued)

*Primary Examiner* — Michael P Stafira
(74) *Attorney, Agent, or Firm* — Leydig, Voit & Mayer, Ltd.

(57) ABSTRACT

A laser sensor module for detecting a particle density of particles, which includes: a laser; a detector; and a mirror. The laser is arranged to emit a laser beam to the mirror. A movement of the mirror is arranged to redirect the laser beam. The laser beam is displaced with respect to a rotation axis of the mirror such that a focus region of the laser beam is moving with a velocity having components normal and parallel to the optical axis of the redirected laser beam such that an angle between the parallel and the normal velocity component is at least a threshold angle of 2°. The detector is arranged to determine a self mixing interference signal of an optical wave within a laser cavity of the laser, the self mixing interference signal being generated by laser light of the laser beam reflected by at least one of the particles.

14 Claims, 9 Drawing Sheets

(52) U.S. Cl.
CPC ............... *G01N 2015/0693* (2013.01); *G01N 2015/1452* (2013.01); *G01N 2015/1454* (2013.01); *G01N 2015/1486* (2013.01)

(58) Field of Classification Search
CPC ... G01N 2015/1438; G01N 2015/1452; G01N 2015/1454; G01N 2015/1493; G01N 2015/0046; G01N 15/06; G01N 2015/0693; G01N 2015/1486; G01N 15/1456; G01N 15/1429; G01N 15/0211; G01N 15/1459; G01N 15/1431; G01N 2015/0003; G01N 2015/1447; G01N 2021/399; G01N 2015/0038; G01N 21/39; G01N 21/45; G01N 21/53; G01N 2201/0221; G01N 15/0227; G01N 15/10; G01N 15/1012; G01N 15/14; G01N 15/1468; G01N 15/147; G01N 2001/2276; G01N 2015/003; G01N 2015/0042; G01N 2015/0053; G01N 2015/0065; G01N 2015/0222; G01N 2015/0294; G01N 2015/1087; G01N 2015/1445; G01N 2015/149; G01N 2015/1497; G01N 2021/0346; G01N 2021/391; G01N 2021/451; G01N 2021/8416; G01N 21/03; G01N 21/0303; G01N 21/0332; G01N 21/255; G01N 21/3504; G01N 21/359; G01N 21/47; G01N 21/49; G01N 2201/06113; G01N 2201/08; G01N 2201/12; G01N 2291/011; G01N 2291/0289; G01N 2291/106; G01N 29/07; G01N 33/0004; G01N 33/0009; G01N 33/0036; G01N 33/54373; G01B 9/02092; G01B 11/161; G01B 11/026; G01B 11/14; G01B 9/02004; G01B 9/0207; G01B 11/16; G01B 11/18; G01B 9/02027; G01B 9/02028; G01B 9/02045; G01B 9/02075; G01B 9/02083; G01B 9/02097; G02B 6/4214; G02B 6/42; G02B 6/4215; G02B 2027/0178; G02B 13/14; G02B 13/24; G02B 2027/0154; G02B 26/10; G02B 26/101; G02B 27/017; G02B 27/0172; G02B 27/0176; G02B 27/0179; G02B 5/208; G02B 5/282; G02B 7/021; G01J 1/0403; G01J 3/4338; G01J 9/02; G01J 9/0246

See application file for complete search history.

(56) References Cited

U.S. PATENT DOCUMENTS

| | | | | |
|---|---|---|---|---|
| 10,732,091 | B2 * | 8/2020 | Van Der Lee | G01N 15/1434 |
| 2016/0313243 | A1 * | 10/2016 | Dittrich | G01N 15/1434 |

FOREIGN PATENT DOCUMENTS

| | | |
|---|---|---|
| WO | 2017017282 A1 | 2/2017 |
| WO | 2017060105 A1 | 4/2017 |

OTHER PUBLICATIONS

Hu: "An Optical Path Length Modulator for Laser Diode Self-Mixing Interference," *Optics and Photonics Journal* 7: 1-5 (Jan. 22, 2017), XP055410625.

Wang, et a.: "Displacement Measurement Based on Fourier Transform Method with External Laser Cavity Modulation," *Review of Scientific Instruments* 72, 8: 3440-3445 (Aug. 31, 2001), XP012039306.

* cited by examiner

LASER SENSOR MODULE FOR PARTICLE DETECTION WITH OFFSET BEAM

CROSS-REFERENCE TO PRIOR APPLICATIONS

This application is a continuation of International Patent Application No. PCT/EP2018/055524, filed on Mar. 7, 2018, which claims priority to European Patent Application No. EP 17160985.2, filed on 15 Mar. 2017. The entire disclosure of both applications are hereby incorporated by reference herein.

FIELD

The invention relates to a laser sensor module, a particle detector comprising such a laser sensor module and a mobile communication device comprising such a laser sensor module or particle detector. The invention further relates to a method of measuring a particle density of small particles. The invention finally relates to a corresponding computer program product.

BACKGROUND

DE 10 2015 207 289 A1 discloses a particle sensor apparatus having an optical emitter device that is configured to emit an optical radiation so that a volume having at least one particle possibly present therein is at least partly illuminable; an optical detector device having at least one detection surface that is struck by at least a portion of the optical radiation scattered at the at least one particle, at least one information signal regarding an intensity and/or an intensity distribution of the optical radiation striking the at least one detection surface being displayable; and an evaluation device with which an information item regarding a presence of particles, a number of particles, a particle density, and/or at least one property of particles is identifiable and displayable, the particle sensor apparatus also encompassing at least one lens element that is disposed so that the emitted optical radiation is focusable onto a focus region inside the volume.

SUMMARY

An embodiment of the present invention provides a laser sensor module for detecting a particle density of particles with a size of less than 20 µm, which includes: a laser; a detector; and a mirror rotatable about a rotation axis. The laser beam is focused to a focus region. The laser is arranged to emit a laser beam to the mirror. A movement of the mirror is arranged to dynamically redirect the laser beam. A direction of the redirected laser beam defines an optical axis. The laser beam is displaced with respect to the rotation axis of the mirror such that the focus region of the laser beam is moving with a velocity comprising components normal and parallel to the optical axis of the redirected laser beam such that an angle $\Box\Box$ between the parallel velocity component with the normal velocity component is at least a threshold angle of 2°. The detector is arranged to determine a self mixing interference signal of an optical wave within a laser cavity of the laser, the self mixing interference signal being generated by laser light of the laser beam reflected by at least one of the particles.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
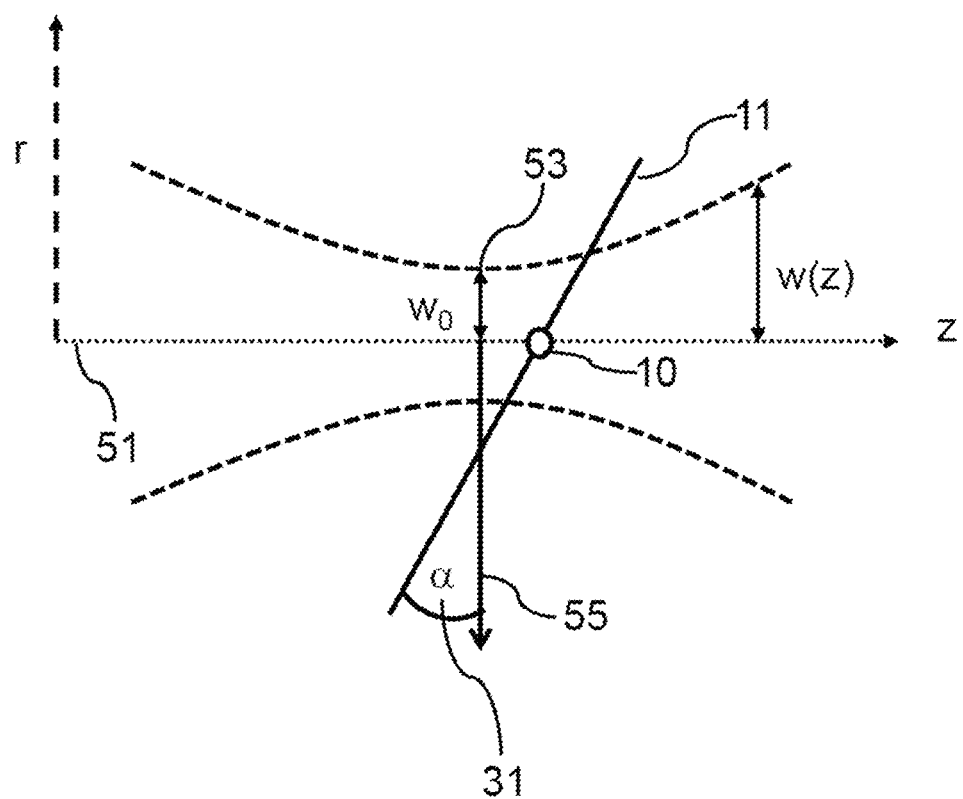
FIG. 1 shows a schematic of a particle trajectory passing a laser beam.

Embodiments of the present invention provide a laser sensor module with improved detection accuracy or improved sensitivity.

According to a first aspect, a laser sensor module for detecting a particle density of particles with a size of less than 20 µm, preferably less than 10 µm in a fluid is provided. The laser sensor module includes a laser, a detector, and a mirror. The laser is arranged to emit a laser beam to the mirror. The mirror is arranged to dynamically redirect the laser beam. A direction of the redirected laser beam defines an optical axis. The detector is arranged to determine a self mixing interference signal of an optical wave within a laser cavity of the laser, the self mixing interference signal being generated by laser light of the laser beam reflected by at least one of the particles. A geometric relation between the laser and the mirror is arranged such that the self mixing interference signal is shifted to higher frequencies. The laser sensor module is arranged such that an angle α between trajectories of particles at rest with respect to a velocity vector of the redirected laser beam normal to the optical axis is at least a threshold angle of 2°. The threshold angle may be 3° or even 4° in order to increase reliability of the measured particle density. The laser sensor module may include two, three, four or more lasers and/or detectors. The lasers and detectors may, for example, be arranged in an array on a common semiconductor chip.

The movement of the mirror, which is used to redirect the laser beam, results in the direction of the optical axis being a function of time. There is, thus, a relative movement between the particles in the laser beam even in the case that the particles are at rest. The movement of the laser beam increases the detection volume of the laser sensor module and, therefore, the count rate of detected particles within a predetermined time period. Experiments have shown that particle signals, which are generated by particles at rest passing orthogonally through the laser beam, have, in the frequency spectrum, the most signal energy at DC. Shifting these signals to higher frequencies avoids 1/f noise. Also, particles at rest in focus that have a 90° phases shift with respect to light in the laser cavity, are not detectable when passing orthogonally through a focus of the laser beam. It is thus difficult or even impossible to detect the respective particles. The latter situation is usually the case if there is essentially no or low air flow as, for example, during measurements in a closed room. The count rate may therefore be reduced in such situations. This may reduce the detection accuracy or sensitivity of particle density detection. Arranging the geometric relation between the laser and the mirror such that the angle $\alpha$ between trajectories of particles addressed with respect to a velocity vector of the redirected laser beam normal to the optical axis is at least a threshold angle of 2° shifts the self mixing interference signal to higher frequencies and increases the count rate.

The sensor module may be arranged to detect contamination of gases, especially air with particles characterized by a particle size distribution including particles with a size between 50 nm and 50 µm, 100 nm and 20 µm, 200 nm and 10 µm. The sensor module may especially arranged to determine a particle density like the PM 10 and the PM 2.5 value as defined by the corresponding National Air Quality Standard for Particulate Matter of the US Environmental Protection Agency.

A measure to adapt the geometric relation between the laser and the mirror described above may be to arrange the laser sensor module (e.g. by arranging laser or the mirror or by providing an optical arrangement) such that the laser beam emitted by the laser is displaced with respect to a rotation axis of the mirror. An optical axis of the laser beam prior to redirection by the mirror may in this embodiment be not aligned with the rotation axis of the mirror. Laser light on the optical axis prior to redirection by the mirror does in this embodiment not hit the center of rotation of the movable mirror (e.g. MEMS mirror and the like). The laser sensor module for detecting a particle density of particles with a size of less than 20 µm, preferably less than 10 µm in a fluid includes in this respect:

The laser, which is arranged to emit a laser beam to the moveable mirror, the laser beam being off-set to the center of rotation of the moveable mirror.

The mirror may be arranged to rotate around the center of rotation to dynamically redirect the laser beam to a focus region of the laser beam. The direction of the redirected laser beam defines an optical axis. The laser beam is focused such that the focus region or focus of the laser beam is moving with a velocity including components normal and parallel to the optical axis of the redirected laser beam such that an angle $\alpha$ between the parallel velocity component with the normal velocity component of the velocity is at least a threshold angle of 2°.

The detector is arranged to determine the self mixing interference signal of the optical wave within the laser cavity of the laser, the self mixing interference signal being generated by laser light of the laser beam reflected by at least one of the particles in the focus region.

The rotation axis may, for example, be arranged off-center with respect to the mirror. The mirror is characterized in this case by two arms with different lengths with respect to the rotation axis.

The rotation axis may alternatively be arranged across a center of the mirror. The mirror is characterized in this case by two arms with the same lengths with respect to the rotation axis. The laser beam is decentered with respect to the mirror such that the optical axis of the laser beam prior to deflection penetrates the mirror above or below the rotation axis for all deflection angles depending on the relative arrangement of the mirror with respect to the laser.

The laser beam may be decentered in a way such that most of the light emitted by the laser is redirected by means of the mirror. It should be avoided that a substantial part of the laser light does not hit the mirror under all deflection angles.

The laser sensor module may include at least one optical unit. The at least one optical unit is arranged to focus the laser beam to the particles. The particles are detected in a detection volume defined by a focus or focus region provided by optical unit and the movement of the mirror. The optical unit may, for example, include a lens or one or more comparable optical devices which may support e.g. a thermal lens within the laser in order to increase sensitivity of the laser sensor module.

The laser sensor module may be arranged such that the threshold angle can be changed. Changing the threshold angle may be used in order to adapt sensitivity or accuracy. The laser sensor module may, for example, be arranged to vary the threshold angle in a certain range and to determine a threshold angle at which sensitivity or accuracy of the laser sensor module is highest. The optimization may, for example, be performed by determining the threshold angle at which a maximum particle density is detected.

The laser sensor module may, for example, be arranged such that a relative position between the laser and the rotation axis can be changed in order to vary the threshold angle.

At least one optical device may alternatively or in addition be arranged between the laser and the mirror to change the threshold angle. A movable lens, a liquid crystal device or pockels cell may be examples for such optical devices which may enable variation of the threshold angle.

The laser sensor module may further include an electrical driver. The electrical driver may be adapted to electrically drive the laser or lasers such that the lasers emit laser beams.

The laser sensor module may additionally include an interface by means of which control signals, electrical driving signals or detection signals can be exchanged with an external controller.

According to a further aspect a particle detector is provided. The particle detector includes a laser sensor module according to anyone of the embodiments described above. The particle detector includes an evaluator. The evaluator is arranged to extract the shifted self mixing interference signal from a measurement signal provided by the detector. The evaluator may be an integrated part of the controller or an independent electrical device which may be arranged to interact with the controller.

The evaluator may further be arranged to filter frequency components of the measurement signal below a threshold frequency. The threshold frequency is smaller than the frequency shift of the self mixing interference signal.

The particle detector may include an electrical driver described above.

An air purifier, an exhaust hood, a car, a sensor box or a wearable device like a mobile communication device and the like may include the laser sensor module or particle detector according to any embodiment described above.

According to a further aspect a method of measuring a particle density of particles with a size of less than 20 µm, preferably less than 10 µm in a fluid is presented. The method includes the steps of:

1. emitting a laser beam to a mirror, 2. dynamically redirecting the laser beam by means of the mirror, wherein a direction of the redirected laser beam defines an optical axis,
3. determining a self mixing interference signal of an optical wave within a laser cavity of the laser, the self mixing interference signal being generated by laser light of the laser beam reflected by at least one of the particles, wherein a geometric relation between the laser and the mirror is arranged such that the self mixing interference signal is shifted to higher frequencies, wherein an angle α between trajectories of particles at rest with respect to a velocity vector of the redirected laser beam normal to the optical axis is at least a threshold angle of 2°,
4. analyzing the self mixing interference signal based on the shift of the self mixing interference signal to higher frequencies.

Analyzing the self mixing interference signal based on the shift of the self mixing interference signal to high-frequency may include to filter frequency components of the measurement signal below a threshold frequency. The threshold frequency is smaller than the frequency shift of the self mixing interference signal by means of the threshold angle of at least 2°. The laser beam may be focused to a detection volume as described above.

According to a further aspect a computer program product is presented. The computer program product includes code means which can be saved on at least one memory device of the laser sensor module described above or on at least one memory device of a device including the laser sensor module described above. The code means being arranged such that the method described above can be executed by means of at least one processing device of the laser sensor module described above or by means of at least one processing device of the device including the laser sensor module described above.

The memory device or the processing device may be included by the particle detector (e.g. electrical driver, evaluator etc.) or the device including the particle detector. A first memory device and/or first processing device of the device including the particle detector may interact with a second memory device and/or second processing device included by the particle detector or laser sensor module.

The memory device or devices may be any physical device being arranged to store information, especially digital information. The memory device may be especially selected out of the group solid-state memory or optical memory.

The processing device or devices may be any physical device being arranged to perform data processing especially processing of digital data. The processing device may be especially selected out of the group processor, microprocessor or application-specific integrated circuit (ASIC).

It shall be understood that a laser sensor module, particle detector, and method of have similar and/or identical embodiments.

Further advantageous embodiments are defined below. These and other aspects of the invention will be apparent from and elucidated with reference to the embodiments described hereinafter. In the Figures, like numbers refer to like objects throughout. Objects in the Figures are not necessarily drawn to scale.

Self-mixing interference is used for detecting movement of and distance to an object. Background information about self-mixing interference is described in "Laser diode self-mixing technique for sensing applications", Giuliani, G.; Norgia, M.; Donati, S. & Bosch, T., Laser diode self-mixing technique for sensing applications, Journal of Optics A: Pure and Applied Optics, 2002, 4, S. 283-S. 294 which is incorporated by reference. Detection of movement of a fingertip relative to a sensor in an optical input device is described in detail in International Patent Application No. WO 02/37410 which is incorporated by reference. The principle of self-mixing interference is discussed based on the examples presented in International Patent Application No. WO 02/37410. A diode laser having a laser cavity is provided for emitting a laser, or measuring, beam. At its upper side, the device is provided with a transparent window across which an object, for example a human finger, is moved. A lens is arranged between the diode laser and the window. This lens focuses the laser beam at or near the upper side of the transparent window. If an object is present at this position, it scatters the measuring beam. A part of the radiation of the measuring beam is scattered in the direction of the illumination beam and this part is converged by the lens on the emitting surface of the laser diode and re-enters the cavity of this laser. The radiation re-entering the cavity of the diode laser induces a variation in the gain of the laser and thus in the intensity of radiation emitted by the laser, and it is this phenomenon which is termed the self-mixing effect in a diode laser.

The change in intensity of the radiation emitted by the laser or of the optical wave in the laser cavity can be detected by a photo diode or a detector arranged to determine an impedance variation across the laser cavity. The diode or impedance detector converts the radiation variation into an electric signal, and electronic circuitry is provided for processing this electric signal.

The self-mixing interference signal may in case of particle detection, for example, be characterized by a short signal burst or a number of signal bursts. The Doppler frequency as observed in these signals is a measure for the particle velocity along the optical axis. It may therefore be preferred to use a DC drive current in order to simplify signal detection and signal analysis. A modulated drive current may be used in order to determine the position or velocity of the particle, for example, by means of self-mixing interference signals which may be generated by reflection of laser light at bigger particles or disturbing objects. The distance (and optionally velocity) may be determined within one measurement or in a subsequent measurement step. It may therefore be possible or even beneficial to use a DC drive current in a first period in time in order to generate a measurement signal related to the intended particle number, velocity and a modulated drive current in a second time period in order to determine false objects in the beam. The duration and the intensity of the measurement signal may optionally be used to determine the particle size.

FIG. 1 shows a schematic of a particle trajectory 11 passing a laser beam which is emitted along the optical axis 51. The laser beam is preferably circular symmetric around the optical axis 51 and is characterized by a beam waste 53 with a radius $W_0$ at a focus point or region of the laser beam. The radius w(z) of the laser beam increases depending on a distance z to the focus point along the optical axis 51. The optical axis 51 is dynamically moving depending on a deflection angle of a mirror of a laser sensor module (not shown). A particle 10 crosses the laser beam along the particle trajectory 11 which is caused by a combination of the movement of the particle 10 within the respective fluid (usually air or other gases) and the movement of the laser beam caused by the movement of the mirror redirecting the laser beam. The particle trajectory 11 encloses an angle α with a velocity vector 55 of the redirected laser beam perpendicular to the optical axis 51 of the laser beam (kind of orbital speed). It is obvious from FIG. 1 that a trajectory of particles which do not move with respect to the laser sensor module enclose an angle α of 0° with the velocity vector 55 of the dynamically redirected laser beam. Such particles may be slow or stationary particles with respect to the laser sensor module (not with respect to the moving laser beam) which are usually present at indoor measurements in a closed room. The shape of the laser beam especially around the optical axis may depend on the laser (e.g. VCSEL or side emitter) and optical units or devices used to transform the laser beam emitted by the laser (e.g. wedge shaped optics). The shape may, for example be elliptical instead of circular.

Figure 2:
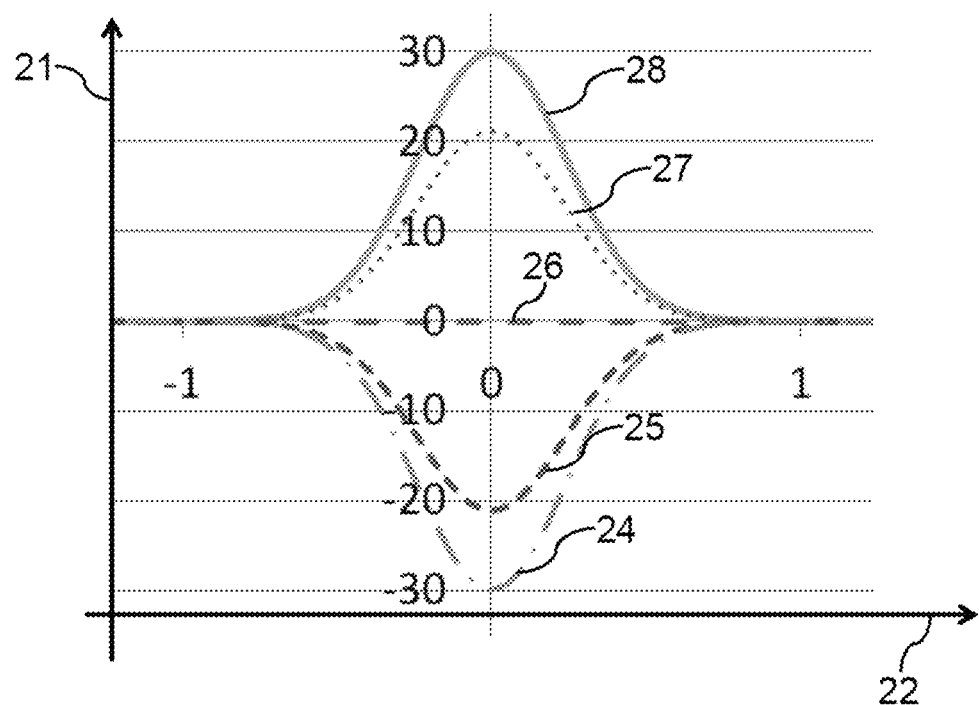
FIG. 2 shows intensity of the self mixing interference signal at a threshold angle of 0°.

FIG. 2 shows an intensity 21 of the self mixing interference signal as a function of time 22 in microseconds at a threshold angle of 0°. The optical axis of the laser beam emitted to the mirror of the laser sensor module (not shown) is in this case aligned with a rotation axis of the mirror. Line 24 shows a measured intensity at 0.21 μm defocus (distance z with respect to the beam waste 53 discussed in FIG. 1 above at which the particle passes a laser beam). Lines 25, 26, 27 and 28 shows the measured intensities at 0.16 μm defocus, 0.11 μm defocus, 0.05 μm defocus and 0 μm defocus respectively. In worst-case situation the measured intensity 26 at 0.11 μm defocus, the particle cannot be detected at all. All particles passing the laser beam which fulfill these conditions would not be detected causing a systematic error of the measured particle density. Apart from a reduced count rate, this would not be a problem if it is known that all particles are static with respect to the laser sensor module. In this case such a systematic error can be estimated and the measurement result can be corrected accordingly. The problem is that it is not known at which moment in time this condition is fulfilled. The situation even within a closed room may dynamically change if, for example, people are moving within the room or in case of, for example, convection within the room.

Figure 3:
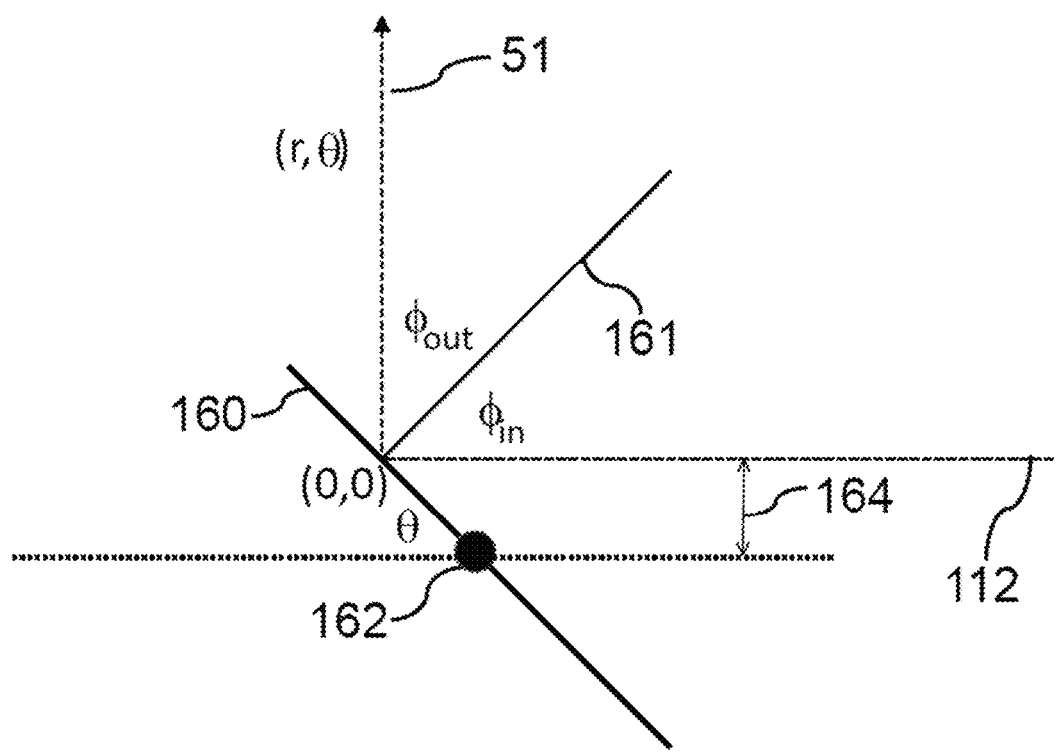
FIG. 3 shows a schematic for a laser beam falling off axis with respect to mirror rotation axis.

FIG. 3 shows a schematic for a laser beam falling off axis with respect to a rotation axis 162 of a mirror 160. FIG. 3 shows an optical axis of the laser beam 112 which is emitted by a laser (not shown) with a beam offset 164 with an axis parallel to the optical axis of the laser beam 112 across the rotation axis 162. The arrow indicates the direction of the laser emission. The laser beam 112 hits the mirror 160 above the rotation axis 162. The mirror encloses with the axis across the rotation axis which is parallel to the optical axis of the laser beam 112 an deflection angle θ. The incoming laser beam 112 is specular reflected by means of mirror 160 (angle of incidence $\phi_{in}$ of the laser beam 112 the same as the angle of reflection $\phi_{out}$ with respect to the normal 161 to mirror surface). The redirected laser beam is emitted along (dynamically changing) optical axis 51. The beam offset causes a defined minimum angle between the particle trajectories 11 of the particles 10 which is at least 2°. The threshold angle can be mathematically described by means of the signal waveform for a particle trajectory 11 which is given by the formula:

$$\frac{\Delta P}{P} \propto \text{Real}\left[e^{-\frac{2(x[t])^2}{w(z[t])^2}} e^{2ikz[t]+\zeta(z[t])} e^{\frac{ik(x[t])^2}{2R(z[t])}} e^{i\phi_{back}}\right]$$

k optical wavevector $$k = \frac{2\pi}{\lambda},$$

v is velocity between particle and focus of laser beam, t is time, w(z) is Gaussian waist parameter at position z and R(z) is the wavefront curvature of the Guassian beam, ζ(z) is the Gouy phase shift at position z, $\phi_{back}$ is the overall optical distance between laser transversal plane of particle and back. The position of the x coordinate and z coordinate as function of time are, x[t]=v t cos(α), z[t]=vt sin(α).

When the particle trajectory 11 has an angle α different than 0° the linear time dependent phase factor is non zero, therefore modulation of the particle signal arises and hence shifting the particle signal away from DC. When expressing the focus point in polar coordinates, taking mirror position where the beam hits the mirror 160 as origin as indicated in FIG. 3 by (0,0) the following formula can be found for the derivative:

$$\frac{dr}{rd\theta} = \frac{-2o\cot[\theta]^2}{-l+o\cot[\theta]},$$

with o is the offset 164, θ the angle of the mirror described above, 1 is the distance from mirror surface to focus (position of beam waste 53 in FIG. 1), $$\frac{dr}{rd\theta}$$

is the angle of the particle trajectory (more precise tan(α)). This derivative gives the angle α between the particle trajectory 11 of particle 10 velocity vector 55 described with respect to FIG. 1. The angle α is zero in case the trajectory is orthogonal to the laser beam as discussed above.

Figure 4:
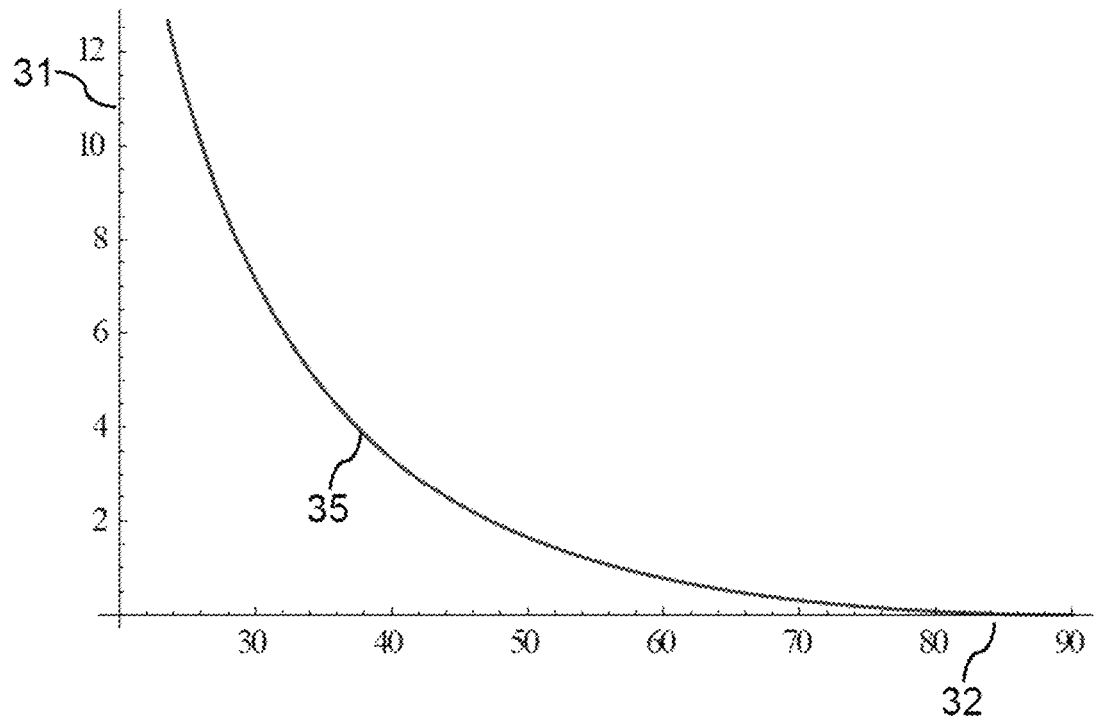
FIG. 4 shows dependence of the angle of the particle trajectory a on deflection angle θ of the mirror.

FIG. 4 shows how the angle α 31 depends on deflection angle θ 32 of the mirror by means of line 35 which is calculated for a distance from mirror surface to focus of l=5 mm and a beam offset 164 of 0.1 mm from the rotation axis 162 of mirror 160. The angle α 31 is different than 0° for all relevant mirror angles θ 32 between 15° and 75°. The offset 164 can thus be used to provide a threshold angle for angle α.

Figure 5:
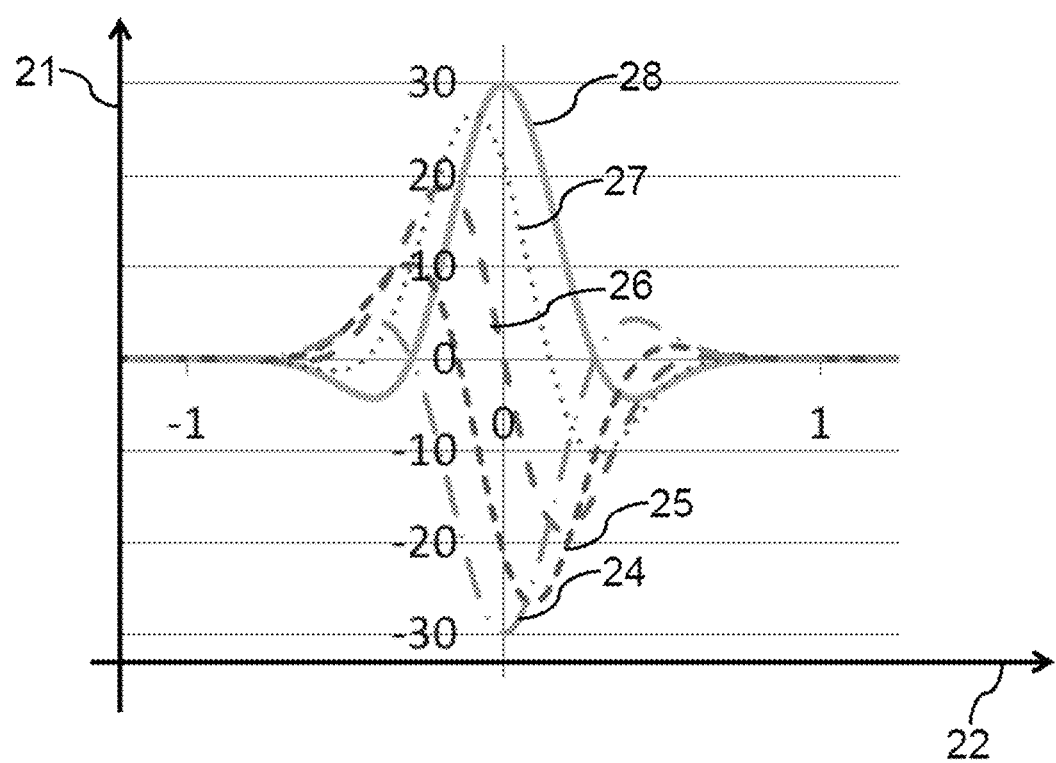
FIG. 5 shows intensity of the self mixing interference signal at a threshold angle of 3°.

FIG. 5 shows intensity of the self mixing interference signal at a threshold angle of 3°. Lines 24, 25, 26, 27 and 28 show the measured intensities at 0.21 μm defocus, 0.16 μm defocus, 0.11 μm defocus, 0.05 μm defocus and 0 μm defocus respectively as discussed with respect to FIG. 2 above. The signals are shifted to higher frequencies and a signal can be detected for all measurement conditions in contrast to the situation discussed with respect to FIG. 2.

In conclusion, when a particle trajectory 11 is orthogonal to the optical axis 51, the observed particle signal has its frequency spectrum around DC and the particles that are at distances that are 90 degrees out of phase cannot be detected. When a small angle (take angle α=2° as a threshold) is introduced between the particle trajectory 11 and the optical axis 51 these issues are resolved. This can be achieved by having the laser beam to be displaced with respect to the rotation axis 162 of the mirror 160 as shown and discussed especially with respect to FIG. 3.

Figure 6:
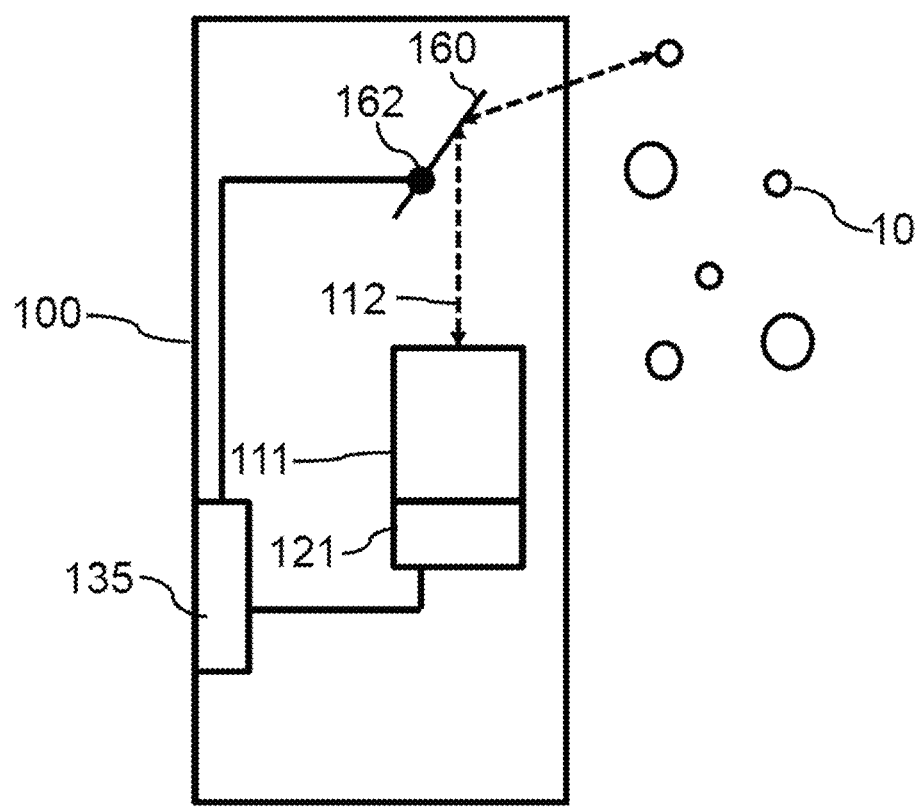
FIG. 6 shows a first embodiment of a laser sensor module.

FIG. 6 shows a first embodiment of a laser sensor module 100. The laser sensor module 100 includes a laser 111 with detector 121 which is in this embodiment an integrated photodiode. The laser sensor module 100 further includes a mirror 160 with a rotation axis 162 which is arranged off-center of the mirror 160. The movement of the mirror 160 around the rotation axis 162 can be controlled by means of control signals provided via interface 135. The laser 111 emits laser beam 112 such that the laser beam 112 hits mirror 160 on the long side of the mirror 160 with respect to the rotation axis 162. The laser beam 112 is redirected by means of mirror 160 depending on deflection angle of the mirror. The redirected laser beam hits a particle 10 and a part of the laser light is reflected by mirror 160 back to a laser cavity of the laser 111. The self mixing interference within the laser cavity causes a variation of the optical wave within the laser cavity. The measurement signal corresponding to the self mixing interference in the laser cavity is detected by means of the integrated photo diode and can be exchanged with an external device by means of interface 135. The interface 135 may optionally be used to supply electrical power to the laser sensor module 100. Alternatively, a separate interface to supply electrical power may be provided. Furthermore, there may be two interfaces in order to exchange control signals for the mirror 160 and to transfer measurement signals related to detected self mixing interference signals instead of the single interface 135.

Figure 7:
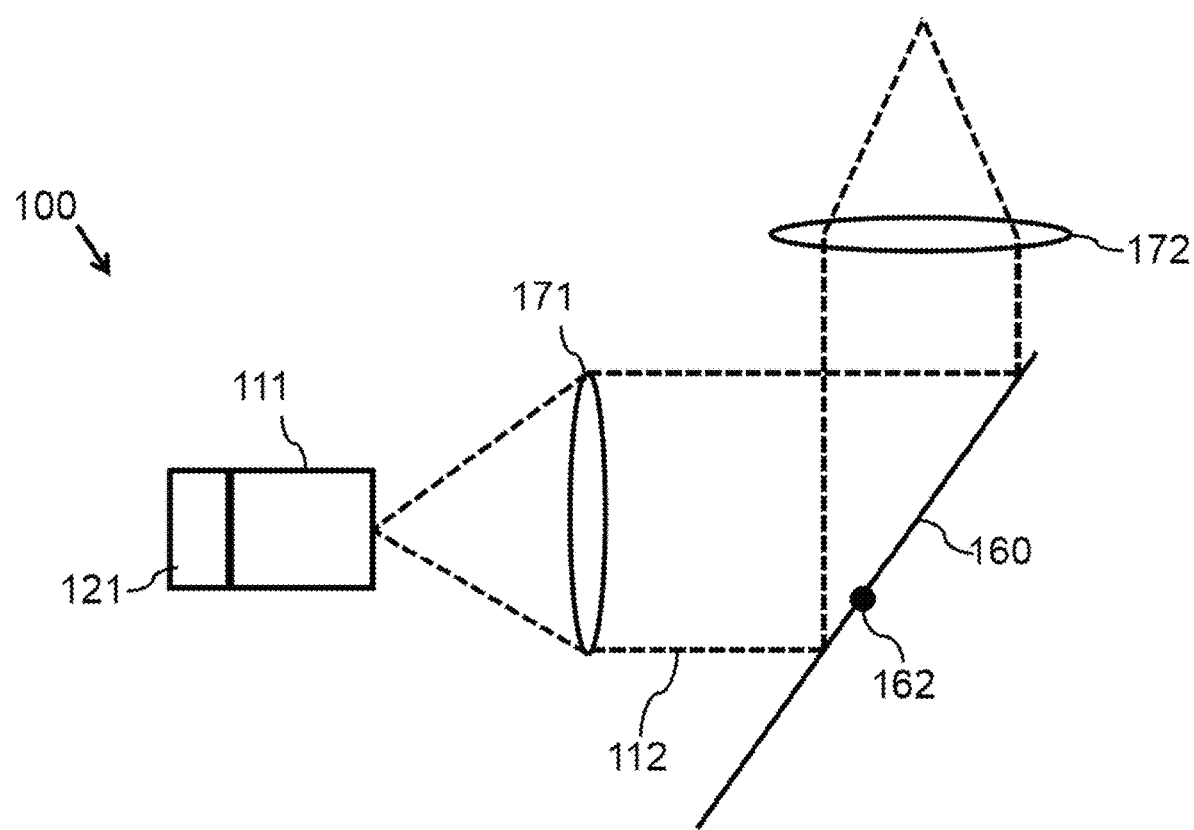
FIG. 7 shows a second embodiment of a laser sensor module.

FIG. 7 shows a second embodiment of a laser sensor module 100. The mirror 160 is in this case symmetric with respect to the rotation axis 162. A first optical unit 171 (e.g. lens or the like) receives laser light emitted by the laser 111 and provides a collimated laser beam 112 on the mirror surface of mirror 160. A center of the collimated laser beam 112 is shifted with respect to the rotation axis 162 of the mirror 160 in order to provide a beam offset as discussed above. The collimated laser beam 112 is dynamically reflected by means of mirror 160 and a second optical unit 172 (e.g. lens or the like) to provide a focused laser beam with a beam waist as discussed with respect to FIG. 1. Laser light reflected by a particle enters a laser cavity of the laser 11 via the inverse emission path and a self mixing interference signal is detected by means of detector 121.

Figure 8:
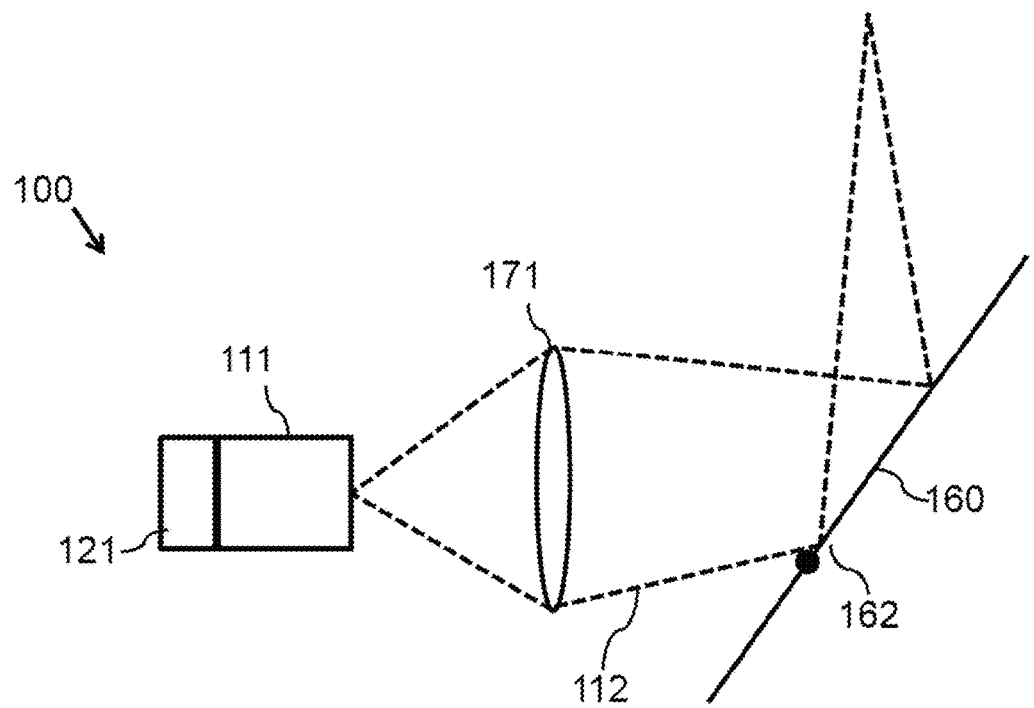
FIG. 8 shows a third embodiment of a laser sensor module.

FIG. 8 shows a third embodiment of a laser sensor module 100. A first optical unit 171 (e.g. lens or the like) receives laser light emitted by the laser 111 and provides a focused laser beam 112 on the mirror surface of mirror 160. A rotation axis 162 of the mirror is arranged off center (two mirror arms with different length) in contrast to mirror 160 discussed with respect to FIG. 7. An optical axis of the focused laser beam 112 is shifted with respect to the rotation axis 162 of the mirror 160. The focused laser beam 112 is dynamically reflected by means of mirror 160 to a focus point as discussed with respect to FIG. 1. Laser light reflected by a particle enters a laser cavity of the laser 11 via the inverse emission path and a self mixing interference signal is detected by means of detector 121.

The first optical device 171, the mirror 160 and/or the laser 111 in the embodiments discussed with respect to FIG. 6, FIG. 7 and FIG. 8 may be movable with respect to each other in order to enable a dynamic adaption of the threshold angle. Alternatively or in addition, the laser 11, the first optical device 171 and/or the mirror 160 may be arranged to dynamically change the distance between the laser and the focal point, thereby generating a threshold angle due to the component movements. As another alternative optical modulators like a pocket cell or a liquid crystal can be used in between the laser 111 an the optical device 171 to generate phase differences as a function of time and thereby effectively shifting the signal to higher frequencies.

Figure 9:
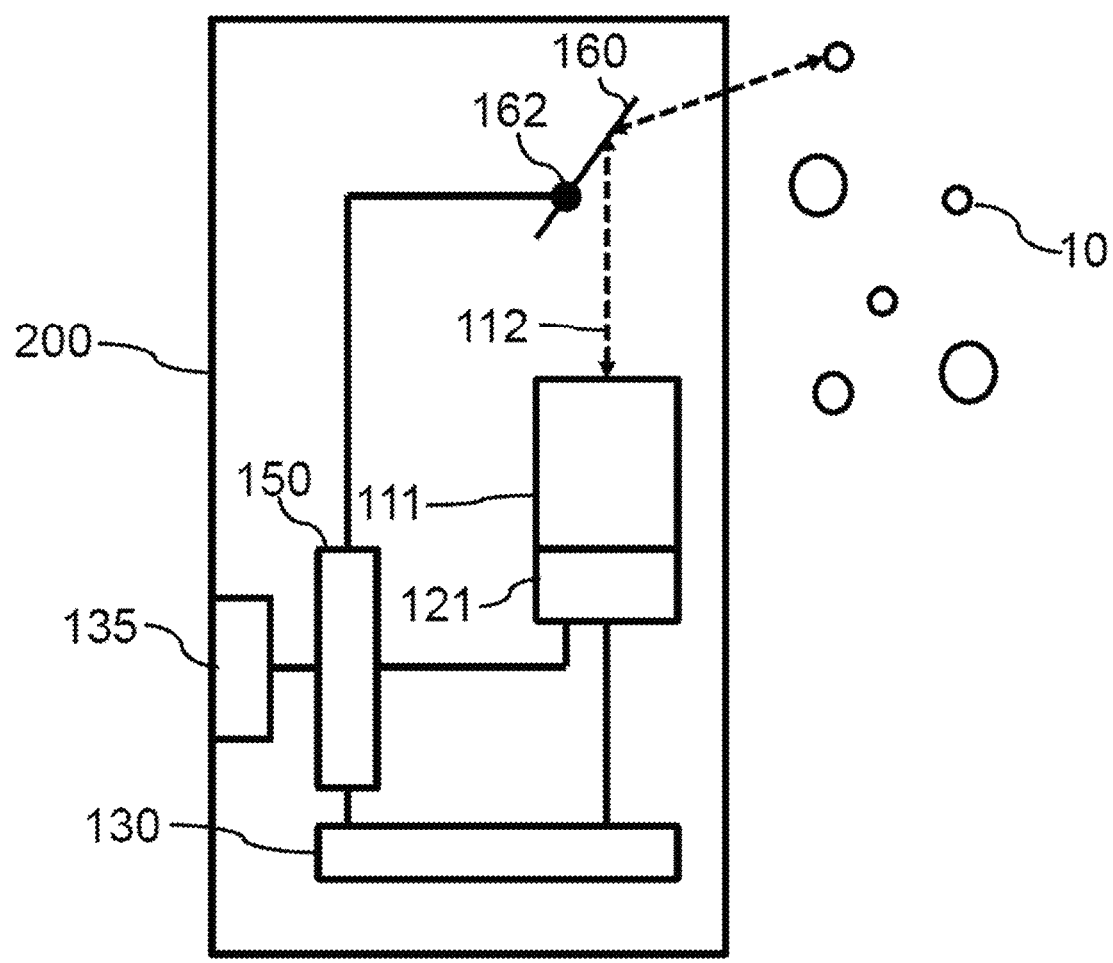
FIG. 9 shows an embodiment of a particle detector.

FIG. 9 shows an embodiment of a particle detector 200. The particle detector 200 includes a laser sensor module 100 which is similar to the laser sensor module 100 discussed with respect to FIG. 6. The particle detector 200 includes an electrical driver 130 for driving the laser 111 and a controller 150 which is arranged to provide control signals to movable mirror 160. The controller 150 is further arranged to receive measurement signals detected based on self mixing interference signals in the laser cavity of the laser 111 which are caused by detected particles 10 as discussed above. The controller 150 further includes an evaluator which is arranged to extract the self mixing interference signal which is shifted to higher frequencies from the measurement signals provided by the detector 121. The evaluator may, for example, include a high pass filter being arranged to filter lower frequency components below a threshold frequency which is determined by the threshold angle.

Figure 10:
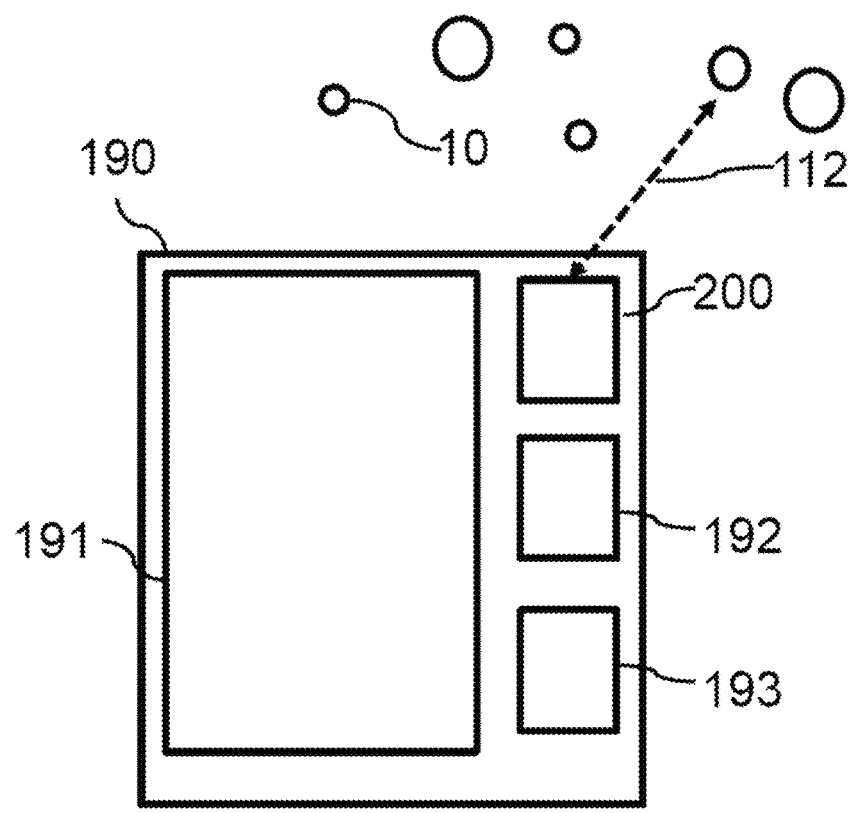
FIG. 10 shows a mobile device comprising the laser sensor module.

FIG. 10 shows a principal sketch of a mobile communication device 190 including at least a part of the particle detector 200 discussed with respect to FIG. 9. The particle detector 200 is adapted to emit a laser beam 112. The mobile communication device 190 includes a user interface 191, a processing device 192 and a main memory device 193. The main processing device 192 is connected with the main memory device 193 and with the particle detector 200. The main processing device 192 includes at least a part of the functionalities of controller 150 which are described above. The main processing device 192 stores data related to particle detection in the main memory device 193. In an alternative embodiment it may also be possible that the main processing device 192 and the main memory device 193 are only used to prepare or adapt data provided by means of the particle detector 200 which may in this case be identical with the particle detector 200 discussed with respect to FIG. 9 such that the data can be presented to a user of the mobile communication device 190 by means of user interface 191. The particle detector 200 may be powered by means of a power supply of the mobile communication device 190. The mobile communication device 190 may alternatively include a laser sensor module 100 described above. All data processing and control may in this case be performed by means of main processing device 192 and main memory device 193. The same principle may be used in other devices including the particle detector 200 or laser sensor module 100.

Figure 11:
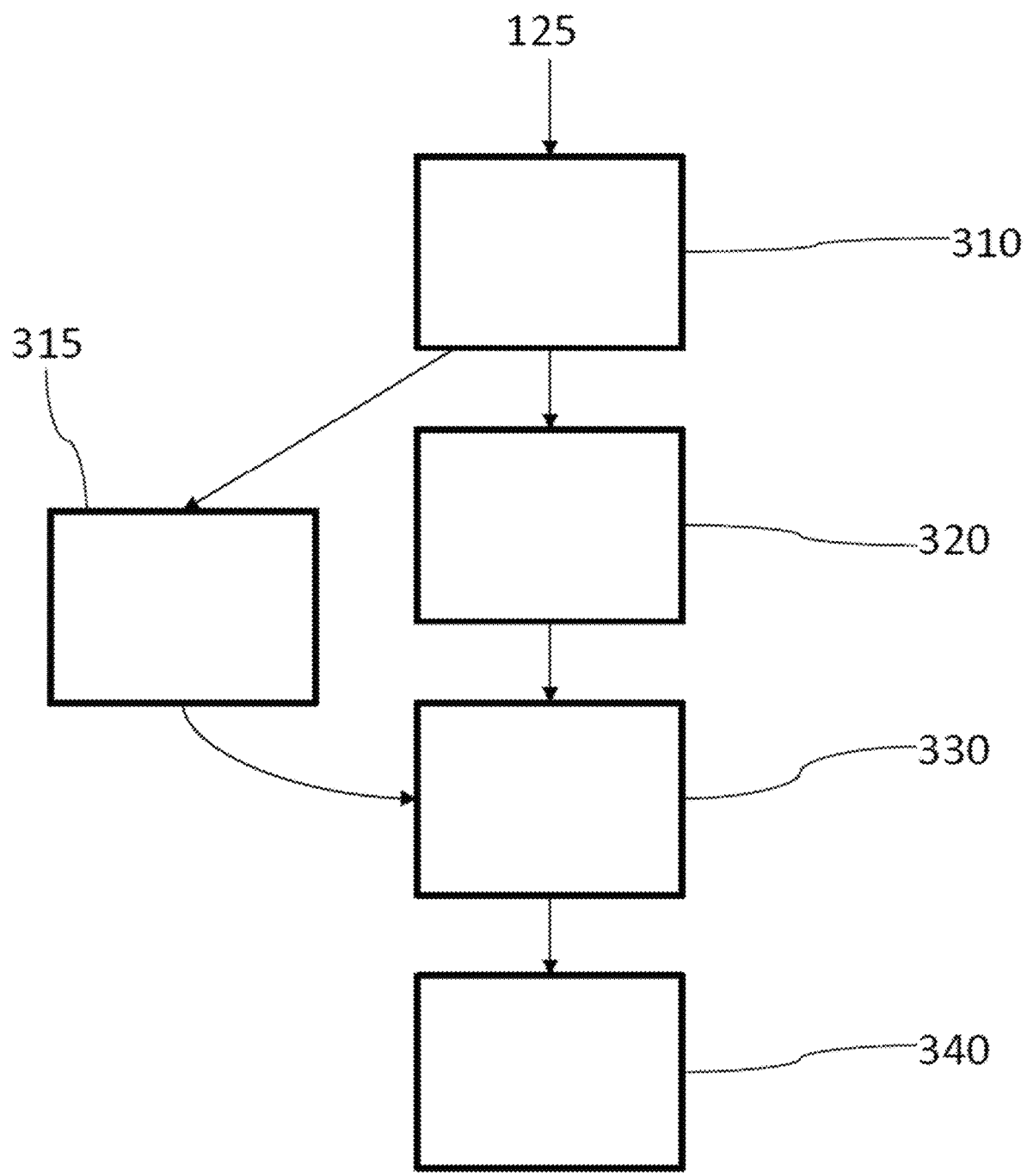
FIG. 11 shows a first embodiment of a method of particle density detection.

FIG. 11 shows a first embodiment of a method of particle density detection. A measurement signal 125 detected by means of detector 121 is filtered in step 310 by means of skipping low-frequency bins after Fast Fourier Transform of the measurement signal 125 provided by means of detector 121 taking into account in the frequency shift caused by arranging the particle sensor module 100 to provide an angle α above the threshold angle of at least 2°. A signal threshold is determined in step 315 which is above a noise measure determined by means of analysis of the transformed measurement signal. The transformed signal is in step 320 further processed by detecting the highest power/intensity in the frequency domain (peak detection). The peaks are compared in step 330 with the threshold determined in step 315. All peaks which are above the threshold are counted and a particle density is determined in step 340 based on the number of particles determined within a predetermined time period.

Figure 12:
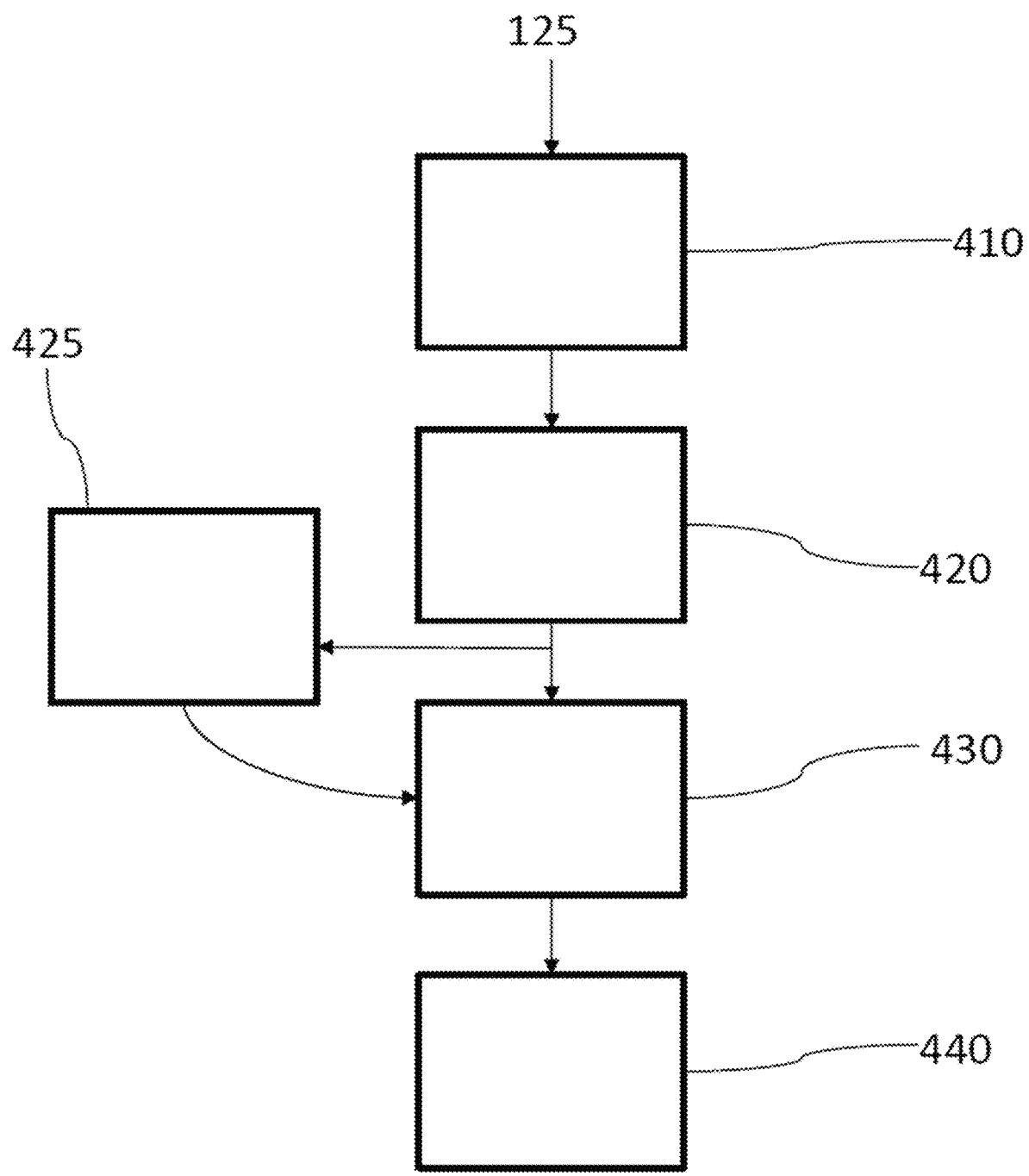
FIG. 12 shows a second embodiment of a method of particle density detection.

FIG. 12 shows a second embodiment of a method of particle density detection. A measurement signal 125 detected by means of detector 121 is filtered in step 410 by means of an (optional) high pass filter 410 because of the shift to high-frequencies by means of the threshold angle. The filtered signal is in step 420 further processed by means of a linear filter (Biquad filter/matched filter). Noise of the linearly filtered measurement signal and a signal threshold is determined in step 425. The linearly filtered signal is compared in step 430 with the signal threshold determined in step 425. In step 440 the number particles are counted based on measurement signals above the threshold and a particle density is determined based on the number of particles determined within a predetermined time period.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

Below is a list of reference numerals:
10 particle
11 particle trajectory
21 intensity
22 time
24 measured intensity at 0.21 µm defocus
25 measured intensity at 0.16 µm defocus
26 measured intensity at 0.11 µm defocus
27 measured intensity at 0.05 µm defocus
28 measured intensity at 0 µm defocus
31 angle $\alpha$ of particle trajectory
32 deflection angle $\theta$ of mirror
35 dependence of angle $\alpha$ from deflection angle $\theta$
51 optical axis
53 beam waist
55 velocity vector
100 laser sensor module
111 laser
112 laser beam
121 detector
125 measurement signal
130 electrical driver
135 interface
150 controller
160 mirror
161 normal to mirror surface
162 rotation axis
164 beam offset
171 first optical unit
172 second optical unit
190 mobile communication device
191 user interface
192 main processing device
193 main memory device
200 particle detector
310 Fast Fourier transformation
315, 425 threshold determination
320 peak detection
330, 430 threshold comparison
340, 440 particle count
410 high pass filtering
420 linear filtering
$w_0$ radius of laser beam at focus point of the laser beam
$w(z)$ radius of laser beam at a distance z with respect to the focus point along the optical axis
$\phi_{in}$ angle of incidence
$\phi_{out}$ angle of reflection

The invention claimed is:

1. A laser sensor module for detecting a particle density of particles with a size of less than 20 µm, wherein the laser sensor module comprises:
a laser;
a detector; and
a mirror rotatable about a rotation axis,
wherein the laser beam is focused to a focus region,
wherein the laser is arranged to emit a laser beam to the mirror,
wherein a movement of the mirror is arranged to dynamically redirect the laser beam,
wherein a direction of the redirected laser beam defines an optical axis,
wherein the laser beam is displaced with respect to the rotation axis of the mirror such that the focus region of the laser beam is moving with a velocity comprising components normal and parallel to the optical axis of the redirected laser beam such that an angle $\alpha$ between the focus velocity with its normal velocity component is at least a threshold angle of 2°, and
wherein the detector is arranged to determine a self mixing interference signal of an optical wave within a laser cavity of the laser, the self mixing interference signal being generated by laser light of the laser beam reflected by at least one of the particles.

2. The laser sensor module according to claim 1, wherein the rotation axis is arranged off-center with respect to the mirror.

3. The laser sensor module according to claim 1, wherein the rotation axis is arranged across a center of the mirror.

4. The laser sensor according to claim 1, wherein the laser is arranged to emit the laser beam off-set to the rotation axis such that the angle α of the redirected laser beam is at least the threshold angle of 2°.

5. The laser sensor module according to claim 1, wherein the laser sensor module comprises at least one optical unit, wherein the at least one optical unit is arranged to focus the laser beam to the particles.

6. The laser sensor module according to claim 1, wherein the laser sensor module is arranged such that the angle α can be changed.

7. The laser sensor module according to claim 6, wherein a relative position between the laser and the rotation axis can be changed.

8. The laser sensor module according to claim 6, wherein at least one optical device arranged between the laser and the mirror is arranged to change the threshold angle.

9. The particle detector comprising a laser sensor module according to claim 1, wherein the particle detector comprises an evaluator, wherein the evaluator is arranged to extract a shifted self mixing interference signal from a measurement signal provided by the detector.

10. The particle detector according to claim 9, wherein the evaluator is arranged to filter frequency components of the measurement signal below a threshold frequency, wherein the threshold frequency is smaller than the frequency shift of the self mixing interference signal.

11. A mobile communication device comprising the laser sensor module according to claim 1.

12. A method of measuring a particle density of particles with a size of less than 20 μm, the method comprising:
emitting a laser beam to a mirror rotatable about a rotation axis, wherein the laser beam is focused to a focus region,
dynamically redirecting the laser beam by a movement of the mirror, wherein a direction of the redirected laser beam defines an optical axis moving in accordance with the movement of the mirror, wherein the laser beam is displaced with respect to the rotation axis of the mirror such that the focus region of the laser beam is moving with a velocity comprising components normal and parallel to the optical axis of the redirected laser beam such that an angle α between the focus velocity with its normal velocity component is at least a threshold angle of 2°,
determining a self mixing interference signal of an optical wave within a laser cavity of the laser, the self mixing interference signal being generated by laser light of the laser beam reflected by at least one of the particles,
analyzing the self mixing interference signal based on the shift of the self mixing interference signal to higher frequencies.

13. The method according to claim 12, wherein the step of analyzing the self mixing interference signal comprises:
filtering frequency components of the measurement signal below a threshold frequency, wherein the threshold frequency is smaller than the frequency shift of the self mixing interference signal.

14. A computer readable medium comprising a computer program product comprising instructions, which when executed by a computer processor cause the processor to perform the following operations:
emit a laser beam to a mirror rotatable about a rotation axis, wherein the laser beam is focused to a focus region,
dynamically redirect the laser beam by a movement of the mirror, wherein a direction of the redirected laser beam defines an optical axis moving in accordance with the movement of the mirror, wherein the laser beam is displaced with respect to the rotation axis of the mirror such that the focus region of the laser beam is moving with a velocity comprising components normal and parallel to the optical axis of the redirected laser beam such that an angle α between the focus velocity with its normal velocity component is at least a threshold angle of 2°,
determine a self mixing interference signal of an optical wave within a laser cavity of the laser, the self mixing interference signal being generated by laser light of the laser beam reflected by at least one of the particles,
analyze the self mixing interference signal based on the shift of the self mixing interference signal to higher frequencies.

* * * * *